United States Patent
Jeon

(10) Patent No.: US 9,013,337 B2
(45) Date of Patent: Apr. 21, 2015

(54) DATA INPUT/OUTPUT DEVICE AND SYSTEM INCLUDING THE SAME

(71) Applicant: SK Hynix Inc., Icheon (KR)

(72) Inventor: Seon Kwang Jeon, Icheon-si (KR)

(73) Assignee: SK Hynix Inc., Icheon (KR)

( * ) Notice: Subject to any disclaimer, the term of this patent is extended or adjusted under 35 U.S.C. 154(b) by 0 days.

(21) Appl. No.: 14/154,588

(22) Filed: Jan. 14, 2014

(65) Prior Publication Data

US 2015/0048957 A1     Feb. 19, 2015

(30) Foreign Application Priority Data

Aug. 13, 2013   (KR) .................. 10-2013-0095908

(51) Int. Cl.
*H03M 9/00*     (2006.01)

(52) U.S. Cl.
CPC ....................................... *H03M 9/00* (2013.01)

(58) Field of Classification Search
CPC ............. G11C 11/4076; G11C 7/1006; G11C 7/1045; G11C 11/4093; G11C 11/4096; G11C 8/16; G11C 7/10; G11C 2207/2245; G11C 2207/105; G11C 29/022
USPC ................. 341/100, 101; 365/230.03, 230.09
See application file for complete search history.

(56) References Cited

U.S. PATENT DOCUMENTS

| | | | | |
|---|---|---|---|---|
| 4,095,265 A | * | 6/1978 | Vrba | 711/169 |
| 6,151,268 A | * | 11/2000 | Yoshikawa | 365/230.09 |
| 6,442,644 B1 | * | 8/2002 | Gustavson et al. | 711/105 |
| 7,274,594 B2 | * | 9/2007 | Pascucci et al. | 365/185.11 |
| 7,605,725 B2 | * | 10/2009 | Puri et al. | 341/67 |
| 7,650,453 B2 | * | 1/2010 | Torii | 710/240 |
| 8,762,654 B1 | * | 6/2014 | Yang et al. | 711/150 |
| 2007/0108611 A1 | * | 5/2007 | Bartley et al. | 257/738 |
| 2009/0300236 A1 | * | 12/2009 | Lee | 710/60 |
| 2011/0310686 A1 | * | 12/2011 | Rajan | 365/201 |
| 2012/0294058 A1 | * | 11/2012 | Best et al. | 365/51 |
| 2013/0176763 A1 | * | 7/2013 | Ware et al. | 365/51 |
| 2014/0063901 A1 | * | 3/2014 | Sunkavalli et al. | 365/148 |
| 2014/0122747 A1 | * | 5/2014 | Heo et al. | 710/11 |

FOREIGN PATENT DOCUMENTS

KR    10-2009-0088455 A    8/2009

* cited by examiner

*Primary Examiner* — Linh Nguyen

(57) ABSTRACT

A data input/output (I/O) device includes a plurality of data units and an I/O assembly. The plurality of data units is coupled to a global I/O (GIO) line through corresponding local I/O (LIO) lines and configured to receive or transmit a plurality of data groups through the corresponding LIO lines. At least one of the plurality of data units have a different operation speed. The I/O assembly performs serial/parallel conversion operations on the plurality of data groups including a high-speed data group and outputs results of the serial/parallel conversion operations. The high-speed data group is output from the at least one of the plurality of data units having the different operation speed.

14 Claims, 8 Drawing Sheets

DATA INPUT/OUTPUT DEVICE AND SYSTEM INCLUDING THE SAME

CROSS-REFERENCE TO RELATED APPLICATION

This application claims priority based upon Korean patent application No. 10-2013-0095908, filed on Aug. 13, 2013, the disclosure of which is hereby incorporated in its entirety by reference herein.

BACKGROUND

Embodiments relate to a data input/output (I/O) device, and more particularly to a data I/O device including a plurality of data units which can be simultaneously activated and operated at various speeds, and a system including the same.

The data I/O device includes one or more data units configured to store data. The data I/O device operates by communicating with an external part.

If several data units are coupled to an external part through a single I/O channel, all the data units included in the data I/O device may have the same operation speed. When the data units are sequentially coupled to the I/O channel, the data units may not simultaneously perform the I/O operation.

SUMMARY

Various embodiments are directed to providing a data input/output (I/O) device and a system including the same that substantially address one or more issues of the related art.

An embodiment of the present disclosure relates to a data I/O device capable of simultaneously activating a plurality of data units coupled to one I/O channel, and a system including the same.

An embodiment of the present disclosure relates to a data I/O device having different operation speeds in such a manner that a plurality of data units coupled to one I/O channel cooperates with a core having a different operation speed, and a system including the data I/O device.

In accordance with an embodiment, a data I/O device includes a plurality of data units coupled to a global I/O (GIO) line through corresponding local I/O (LIO) lines and configured to receive and transmit a plurality of data groups through the corresponding LIO lines, at least one of the plurality of data units having a different operation speed, and an I/O assembly configured to perform serial/parallel conversion operations on the plurality of data groups including a high-speed data group and output results of the serial/parallel conversion operations, the high-speed data group output from the at least one of the plurality of data units having the different operation speed.

The I/O assembly may include an I/O control unit configured to generate an additional I/O signal to control the serial/parallel conversion operations on the plurality of data groups based on a data-unit activation signal, the data-unit activation signal used for controlling the plurality of data units, and an additional I/O unit configured to perform serial/parallel conversion operations on at least some parts of the high-speed data group in response to the additional I/O signal and to output a result of the serial/parallel conversion operation, and an I/O unit configured to perform serial/parallel conversion operations on a plurality of data groups and to output results of the serial/parallel conversion operations, the plurality of data groups including other data groups than the high-speed data group and other parts of the high-speed data group than the at least some parts of the high-speed data group.

The I/O assembly may be configured to increase a data rate in response to the additional I/O signal.

The additional I/O unit may include a SERializer/DESerializer (SERDES) circuit.

The plurality of data units may include a high-speed data unit for inputting and outputting the high-speed data group and a constant-speed data unit, and wherein the high-speed data unit and the constant-speed data unit are configured to cooperate with different cores through the I/O assembly.

The high-speed data unit may cooperate with a graphic core, and the constant-speed data unit may cooperate with a mobile core.

In accordance with an embodiment, a data I/O device includes: a constant-speed data unit coupled to a GIO line through a first local I/O (LIO) line, and configured to input and output a constant-speed data group through the first LIO line; a high-speed data unit configured to transmit and receive a high-speed data group to and from an additional I/O unit through a second local I/O line, the additional I/O unit configured to divide the high-speed data group into the high-speed division data and remaining division data, and to output the high-speed division data to a high-speed global I/O (HGIO) line and the remaining division data to the GIO line, and an I/O assembly configured to perform serial/parallel conversion operations on the constant-speed data group, the remaining division data, and the high-speed division data and to output results of the serial/parallel conversion operation.

The additional I/O unit may include at least one of a SERDES circuit and a multiplexer.

The I/O assembly may include an I/O control unit configured to generate an additional I/O signal to control the serial/parallel conversion operations on the constant-speed and high-speed data groups based on a data-unit activation signal, the data-unit activation signal used for controlling the constant-speed data unit and the high-speed data unit, a first sub I/O unit configured to perform serial/parallel conversion operations on the constant-speed data group and the remaining division data, and a second sub I/O unit configured to perform serial/parallel conversion operations on the high-speed division data.

The high-speed data unit and the constant-speed data unit may be configured to cooperate with different cores through the I/O assembly.

The high-speed data unit may cooperate with a graphic core, and the constant-speed data unit may cooperate with a mobile core.

In accordance with an embodiment, a data I/O system includes a controller including a plurality of cores having different operation speeds, and configured to control a data I/O structure; and the data I/O device structure including a plurality of data devices communicating with the core and configured to selectively activate an additional I/O device to support a high-speed operation of the data device.

The plurality of cores having different operation speeds may include a mobile core and a graphic core.

The data I/O system may further include a plurality of data units coupled to a GIO line through corresponding LIO lines and configured to input and output a plurality of data groups through the corresponding LIO lines, at least one of the plurality of data units having a different operation speed, and an I/O assembly configured to perform serial/parallel conversion operations on the plurality of data groups and output results of the serial/parallel conversion operations, the plurality of data groups including a high-speed data group output from the at least one of the plurality of data units having the different operation speed.

The plurality of data I/O devices may be vertically stacked.

The stacked data I/O devices may be electrically coupled to each other through a through-silicon via (TSV).

It is to be understood that both the foregoing general description and the following detailed description of the present disclosure are exemplary and explanatory and are intended to provide further explanation of the invention as claimed.

BRIEF DESCRIPTION OF THE DRAWINGS

The above and other features will become readily apparent by reference to the following detailed description when considered in conjunction with the accompanying drawings.

DESCRIPTION OF EMBODIMENTS

Reference will now be made in detail to certain embodiments of the present disclosure, examples of which are illustrated in the accompanying drawings. Wherever possible, the same reference numbers will be used throughout the drawings to refer to the same or like parts.

Specific structural and functional descriptions are disclosed herein for illustrative purposes, and embodiments of the present disclosure can be implemented in various ways.

Figure 1:
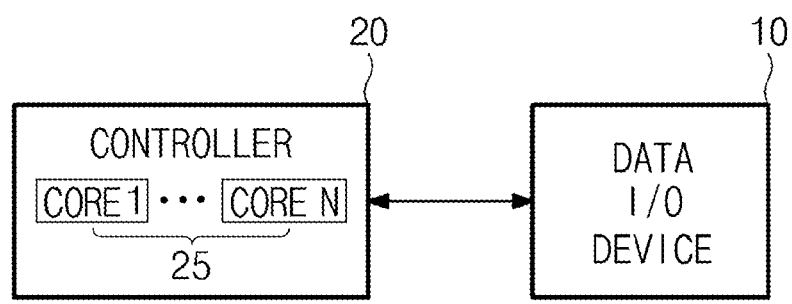
FIG. 1 is a block diagram illustrating a data I/O system according to an embodiment.

FIG. 1 is a block diagram illustrating a data I/O system according to an embodiment.

Referring to FIG. 1, the data I/O system 1 according to an embodiment includes a data I/O device 10 and a controller 20.

The data I/O device may include a plurality of data units. The data I/O devices 10 may write data in the data units based on control signals received from the controller 20, or may provide the data written in the data units to the controller 20.

For example, signals exchanged between the data I/O device 10 and the controller 20 include data, clock, and command signals.

In an embodiment, the controller 20 includes a plurality of cores 25. For example, the cores 25 include a mobile core, a graphic core, etc. The controller 20 including the cores 25 may be referred to as an Application Processor (AP). In other embodiments, a plurality of cores may be implemented separately from the controller 20.

If the data I/O system 1 according to an embodiment includes a plurality of cores 25 having different operation speeds, multiple data units contained in the data I/O device 10 may simultaneously operate with the cores having different operation speeds. For example, a graphic core may be faster than a mobile core by two times. Therefore, the data I/O speed of a data unit configured to operate with the graphic core may be two times faster than that of a data unit configured to operate with the mobile core.

For cooperation with each of the cores 25 having different operation speeds, the controller 20 may designate an address of a corresponding data unit of the data I/O device 10 so as to designate an operation mode. According to embodiments, the data units having different operation speeds may have I/O configurations different from those of other data units. Different I/O configurations will hereinafter be described in detail.

Since the data I/O system 1 according to an embodiment may simultaneously operate with the cores 25 having different operation speeds, a total operation speed of the data I/O system 1 may be reduced compared to that of a conventional data I/O system in which each of cores operates sequentially. As a result, data I/O performance or throughput of the data I/O system 1 can be improved.

Figure 2:
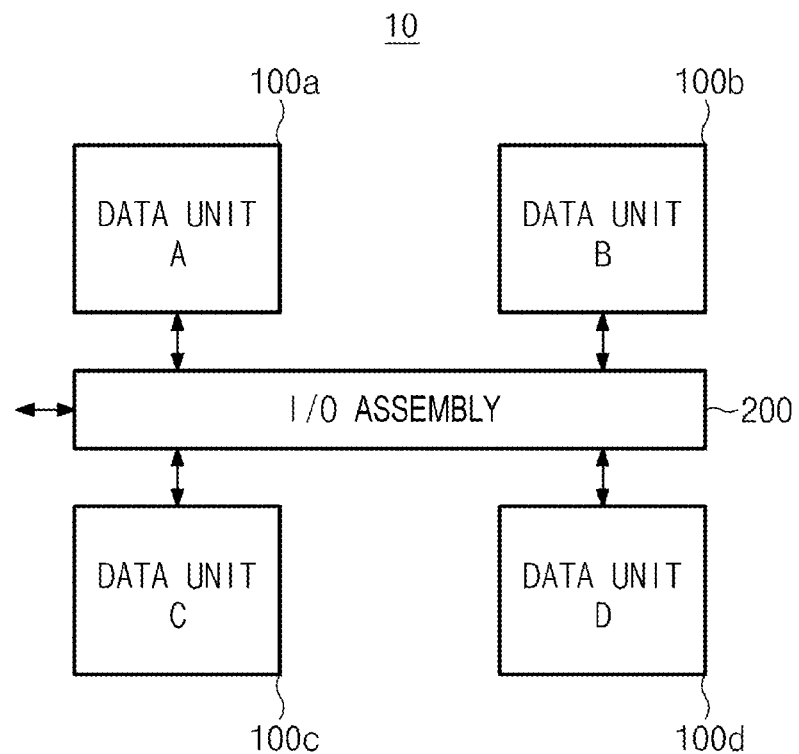
FIG. 2 is a block diagram illustrating the data I/O device shown in FIG. 1.

FIG. 2 is a block diagram illustrating the data I/O device 10 shown in FIG. 1.

Referring to FIG. 2, the data I/O device 10 may include a plurality of data units 100a, 100b, 100c, and 100d and an I/O assembly 200. In an embodiment, the I/O assembly 200 includes a plurality of I/O units.

The plurality of data units 100a, 100b, 100c, and 100d may be configured in units of a bank, and each data unit 100a, 100b, 100c, or 100d may include a sense-amplifier (sense-amp), a row address/column address decoder, an I/O gate, etc.

In an embodiment, the data units 100a, 100b, 100c, and 100d are coupled to a global I/O (GIO) line of the I/O assembly 200 through corresponding local I/O (LIO) lines, respectively.

In an embodiment, the I/O assembly 200 is coupled to the controller 20 (see FIG. 1) through one GIO line, and may be referred to as one I/O channel hereinafter.

For example, one I/O channel is coupled to one core, so that it can be operated at the substantially same operation speed. According to an embodiment, one I/O channel is coupled to a plurality of cores so that it can be operated at different operation speeds of the plurality of cores.

The number of data bits capable of being stored through the GIO line for a predetermined time may be limited. If the operation speed is increased, the number of data bits loaded on the GIO line may become greater than the limited number of data bits, thereby resulting in the occurrence of undesirable issues.

Figure 3:
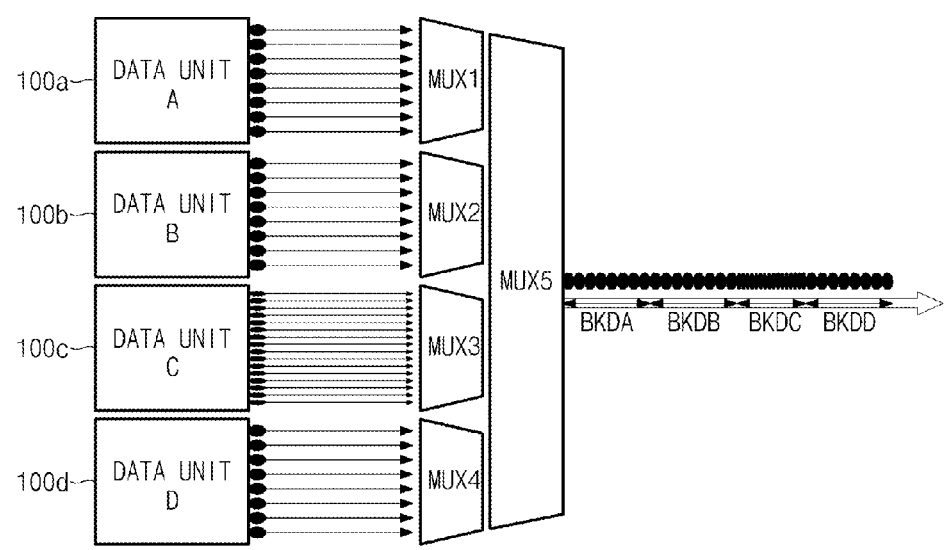
FIG. 3 is a diagram illustrating operations of the data I/O device according to an embodiment.

FIG. 3 is a diagram illustrating operations of the data I/O device according to an embodiment.

Referring to FIG. 3, data groups BKDA, BKDB, BKDC, and BKDD may be provided to the I/O assembly 200 (See FIG. 2) through the data unit A 100a, the data unit B 100b, the data unit C 100c, and the data unit D 100d. The respective data groups BKDA, BKDB, BKDC, and BKDD are serially converted through a SERializer/DESerializer (SERDES) circuit, and then output to the controller 20 (See FIG. 1).

As shown in FIG. 3, the operation speed of the data unit C 100c is two times higher than that of each of the data unit A 100a, the data unit B 100b, and the data unit D 100d.

For example, the data groups may have substantially the same output time on the basis of a burst operation in association with one data unit. The data output of the data unit C 100c may have a double data rate. Alternatively, the data unit C may have the same operation speed and be differentially operated to increase the actual data I/O speed.

Hereinafter, a data unit (e.g., the data unit A 100a, the data unit B 100b, or the data unit D 100d) operating at a general speed is referred to as a constant-speed data unit. Another data unit (e.g., the data unit C 100c) operating at a higher speed than the general speed of each constant-speed data unit, is referred to as a high-speed data unit. In addition, I/O data of the constant-speed data unit are referred to as a constant-speed data group, and I/O data of the high-speed data unit are referred to as a high-speed data group.

The following description will describe in detail particular embodiments that include data units having different operation speeds as shown in FIG. 3. These embodiments will be described on the basis of data I/O devices. For example, these data I/O devices may be contained in the data I/O device 10 of the data I/O system 1 shown in FIG. 1.

Figure 4:
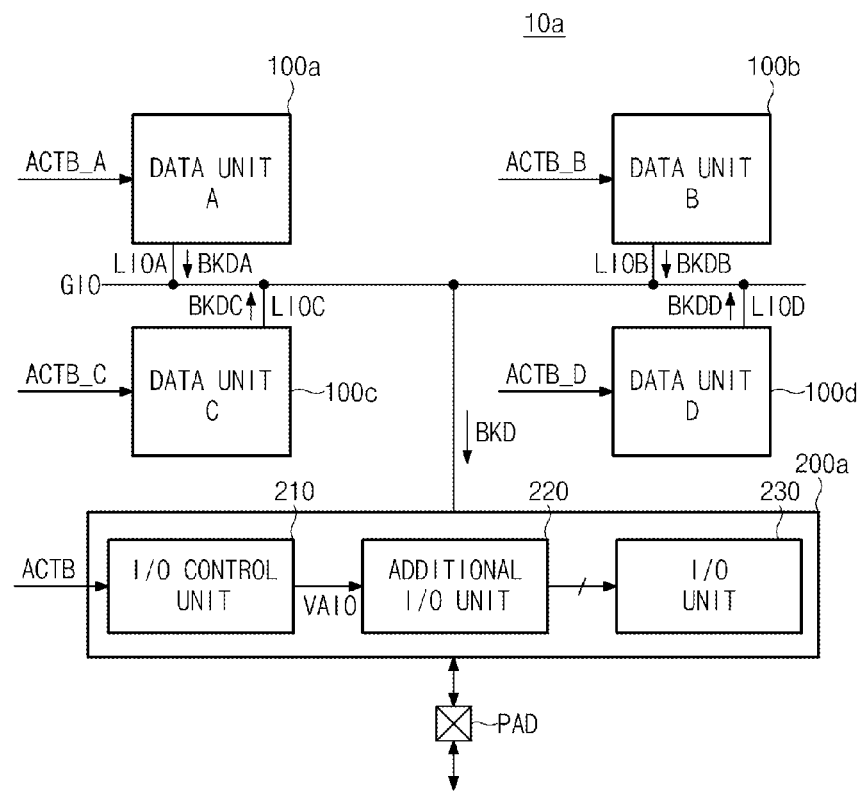
FIG. 4 is a block diagram illustrating a data I/O device according to an embodiment.

FIG. 4 is a block diagram illustrating a data I/O device according to an embodiment.

Referring to FIG. 4, a data I/O device 10a includes a plurality of data units 100a, 100b, 100c, and 100d and an I/O assembly 200a.

The data units 100a, 100b, 100c, and 100d may be substantially identical to those of FIG. 2, and a detailed description thereof will be omitted herein for convenience of description.

The data I/O device 10a shown in FIG. 4 includes an I/O assembly 200a having an I/O control unit 210, an additional I/O unit 220, and an I/O unit 230.

The data I/O device 10a includes the additional I/O unit 220, so that different data bits (e.g., more data bits) can be input or output during substantially the same output time of a data group BKD. In an embodiment, the additional I/O unit 220 is selectively activated and operated.

In an embodiment, the data unit A 100a, the data unit B 100b, and the data unit D 100d provide 8-bit data groups BKDA, BKDB, and BKDD to the GIO line GIO through a local I/O line A LIOA, a local I/O line B LIOB, and a local I/O line D LIOD for a predetermined time, respectively. The I/O assembly 200a may receive the data groups BKDA, BKDB, and BKDD written in respective data units from the GIO line GIO, and may provide the received data to the pad PAD through the I/O unit 230 for a predetermined time. The controller 20 shown in FIG. 1 may receive data through the pad PAD.

In this embodiment, data unit C 100c provides 16-bit data group BKDC to the GIO line GIO. The data units 100a, 100b, 100c, and 100d provide the data groups BKDA, BKDB, BKDC, and BKDD during substantially the same time. As a result, an additional serial/parallel conversion operation may be desired for outputting (or inputting) the 16-bit data group BKDC.

When the speed of data (e.g., from the local I/O line C LIOC) provided to the GIO line GIO increases, the number of data bits capable of being transmitted through the GIO line may be limited to a predetermined number of bits. Alternatively, a speed of serially converting the received data bits may be lower than the desired operation speed.

Therefore, the I/O assembly 200a may further include the additional I/O unit 220. The additional I/O unit 220 may be activated in response to an additional I/O signal VAIO of the I/O control unit 210. In an embodiment, the I/O control unit 210 generates an additional I/O signal VAIO based on a data unit activation signal ACTB. For example, the data unit activation signal ACTB includes a data-unit-A activation signal ACTB_A, a data-unit-B activation signal ACTB_B, a data-unit-C activation signal ACTB_C, and a data-unit-D activation signal ACTB_D. The data-unit activation signal ACTB may include operation information of data units A, B, C, and D. For example, the operation information includes information indicating an operation to be performed (e.g., write, read, refresh, etc.) by each data unit, and further includes other information indicating the operation speed of each data unit.

Therefore, upon receiving a data unit activation signal ACTB, the I/O control unit 210 may determine which one of the operation speeds will be used in the output operation of the data group BKD at a specific time. In addition, the data group BKD can be provided to the respective data units 100a, 100b, 100c and 100d at the operation speed determined by the I/O control unit 210.

In this embodiment, the data units A, B, and D have an operation speed to provide the 8-bit data groups BKDA, BKDB, and BKDD, and the I/O unit 230 serializes the 8-bit data group BKD corresponding to one of the data groups BKDA, BKDB, and BKDD during a predetermined time. When the data unit C 100c has an operation speed two times higher than the operation speed of other data units A, B, and D, the I/O unit 230 and additional I/O unit 220 serializes 16-bit data. When the 16-bit data is serialized during the predetermined time, since the I/O unit 230 can serialize 8-bit data during the predetermined time, the I/O control unit 210 activates the additional I/O unit 220 based on the additional I/O signal VAIO to serialize additional 8-bit data.

The activated additional I/O unit 220 which can serialize 8-bit data, operates in parallel to the I/O unit 230 so as to serialize the 16-bit data group BKDC. As a result, the serialized 16-bit data group BKDC can be applied to the pad PAD without increasing the serializing speed of the additional I/O unit 220 and the I/O unit 230.

According to an embodiment, the additional I/O unit 220 includes a SERializer/DESerializer (SERDES) structure. In an embodiment, the additional I/O unit 220 may include a pipeline structure.

The additional I/O unit 220 and the I/O unit 230 may sequentially provide serialized data bits to the pad PAD.

According to an embodiment, the data I/O device 10a includes the data units 100a, 100b, 100c, and 100d having different operation speeds, and further includes the additional I/O unit 220, so that multiple data units can be activated.

For example, assume that the data unit A 100a and the data unit B 100b are simultaneously activated. If the 8-bit data group BKDB of the data unit B and the 8-bit data group BKDA of the data unit A are applied through the GIO line, the data I/O operation may be substantially identical to the operation of the 16-bit data unit C 100c.

Specifically, assuming that the data I/O device 10a receives the data-unit-A activation signal ACTB_A and the data-unit-B activation signal ACTB_B within a predetermined time $t_{RRD}$, two data units 100a and 100b are defined as being "simultaneously activated." The additional I/O unit 220 may be activated to process the 8-bit data group BKDA of the data unit A and the 8-bit data group BKDB of the data unit B.

In accordance with an embodiment, a command capable of simultaneously activating a plurality of data units may be allocated to the data I/O device 10a.

Figure 5:
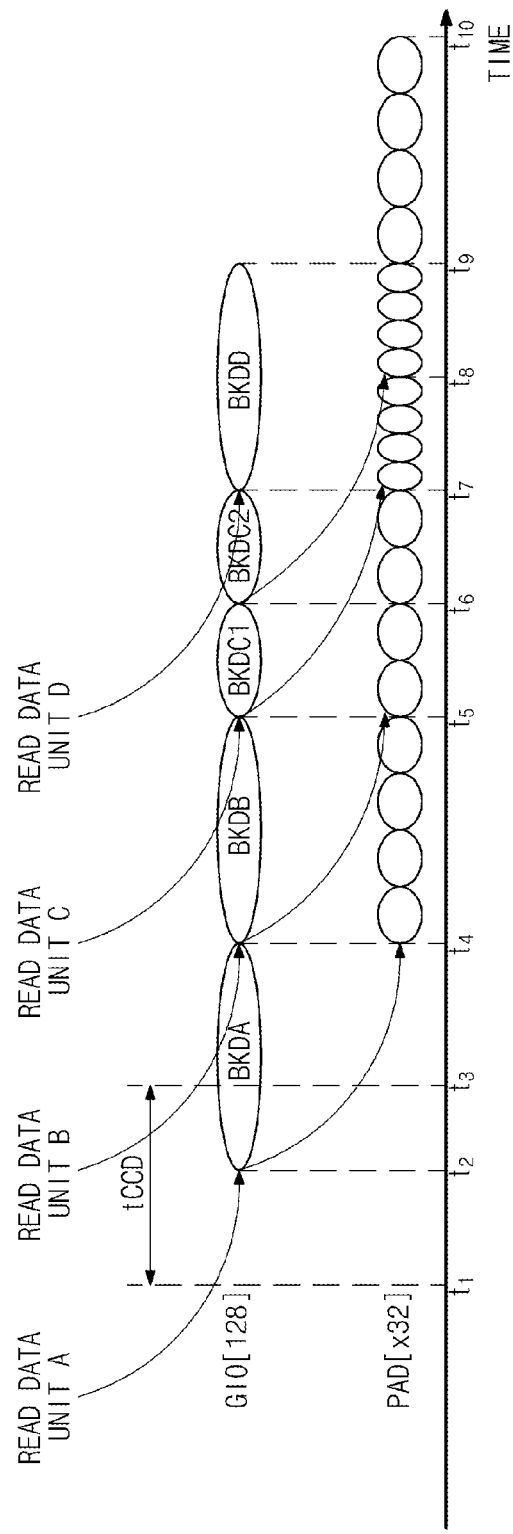
FIG. 5 is a timing diagram illustrating operations of the data I/O device shown in FIG. 4.

FIG. 5 is a timing diagram illustrating operations of the data I/O device shown in FIG. 4.

Referring to FIG. 5, a read command of the data unit A 100a serving as the data-unit-A activation signal ACTB_A is applied to the data I/O device 10a at a first time t1. Then, the data group BKDA of the data unit A is provided to the GIO line GIO at a second time t2, which occurs before a CAS-to-CAS Delay time $t_{CCD}$ elapses from the first time t1. For example, $t_{CCD}$ may be 4~8 clock cycles.

The data group BKDA of the data unit A loaded on the GIO line GIO is synchronized with a data strobe signal DQS, so that the data group BKDA of the data unit A is output through the pad PAD at a fourth time t4.

In addition, the data-unit-B activation signal ACTB_B is applied to the data I/O device 10a at a time between the second time t2 and the fourth time t4. A read operation of the data unit B is carried out based on the data-unit-B activation signal ACTB_B, and then the data group BKDB of the data unit B is provided to the GIO line GIO at the fourth time t4. The fourth time t4 is before the CAS-to-CAS Delay time $t_{CCD}$ elapses from the time when the data-unit-B activation signal ACTB_B has been applied. The data group BKDB of the data unit B loaded on the GIO line GIO is synchronized with the data strobe signal DQS so that the data group BKDB of the data unit B is output through the pad PAD at a fifth time t5.

One part BKDC1 included in the data group BKDC of the data unit C is applied to the GIO line GIO from the fourth time t4 to a sixth time t6. For example, the part BKDC1 corresponds to a half of the data group BKDC of the data unit C.

Since the GIO line GIO includes a buffer therein, an overflow may arise on the condition that the GIO line GIO receives a data group having a number of data bits equal to or greater than a predetermined number. Thus, when the GIO line GIO receives the data group BKDC of the data unit C having a number of data bits equal to or greater than the predetermined number, an overflow may arise. Since the number of data bits included in the part BKDC1 is the half of the number of data bits included in the data group BKDC, the overflow may be prevented.

In an embodiment, the part BKDC1 has the same number of bits as the number of data bits of the data groups BKDA, BKDB, and BKDD of other data units, and BKDC1 may be output to the pad PAD from a seventh time t7 to an eighth time t8. In this case, the speed of the data strobe signal DQS is increased by two times.

Alternatively, the part BKDC1 and the other part BKDC2 may have different number of bits. Thus, the part BKDC1 has different number of bits from the number of data bits of the data groups BKDA, BKDB, and BKDD of other data units.

From the sixth time t6 to the seventh time t7, the remaining part BKDC2 of the data group BKDC of the data unit C is loaded on the GIO line, and is output through the pad PAD from the eighth time t8 to a ninth time t9.

Similarly to the data groups BKDA and BKDB as described above, the data group BKDD of the data unit D is loaded on the GIO line GIO from the seventh time t7 to the ninth time t9, and is output through the pad PAD at a time from the ninth time t9 to a tenth time t10.

As described with reference to FIG. 4, the additional I/O unit 220 is activated to process the data group BKDC of the data unit C having more data bits than the other data groups BKDA, BKDB, and BKDD. For example, the I/O unit 210 and the additional I/O unit 220 perform serializing operations in parallel so that the parts BKDC1 and BKDC2 of the data group BKDC are serialized within a predetermined time.

As described above, the data I/O unit 10a according to an embodiment controls data loaded on the GIO line GIO, and applies the received data to the pad PAD using the additional I/O unit 220, so that the pad PAD can output a plurality of data bits through data units having different operation speeds.

The above-mentioned embodiment has been disclosed on the basis of a specific configuration through which data is output to the pad during the read operation. A write operation to be performed upon receiving data through the pad, may also be achieved in a similar way to the above-described read operation.

Figure 6:
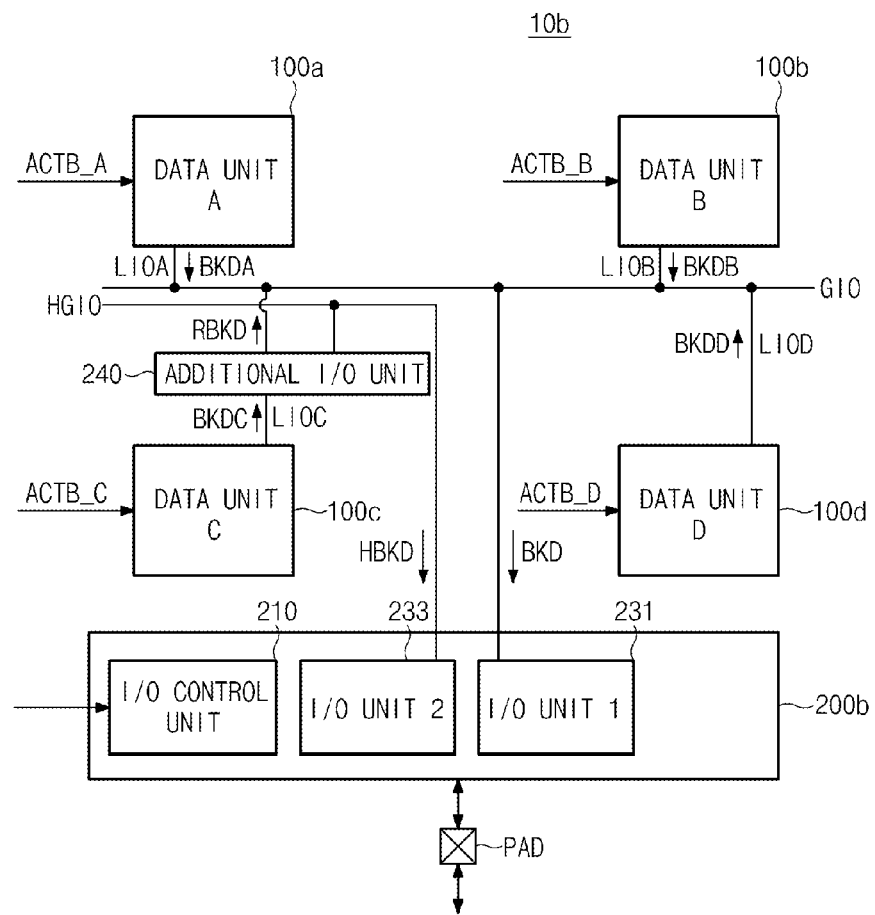
FIG. 6 is a block diagram illustrating a data I/O device according to an embodiment.

FIG. 6 is a block diagram illustrating the data I/O device 10b according to an embodiment.

Referring to FIG. 6, the data I/O device 10b may include a plurality of data units 100a, 100b, 100c, and 100d, an I/O assembly 200b, and an additional I/O unit 240.

In comparison with the specific embodiment shown in FIG. 4, the data I/O device 10b further includes a high-speed global I/O (GIO) line HGIO coupled to a higher-speed data unit (e.g., data unit C 100c of FIG. 6). The data unit C 100c is coupled to the I/O assembly 200b through the high-speed GIO line HGIO.

The data group BKDC output from the data unit C 100c is provided to the additional I/O unit 240. The additional I/O unit 240 divides the data group BKDC into several parts. In an embodiment, the additional I/O unit 240 divides the data group BKDC using time division. After dividing the data group BKDC into the high-speed division data HBKD and the remaining division data RBKD, the high-speed division data HBKD and remaining division data RBKD are provided to the high global I/O line HGIO and the GIO line GIO, respectively. In an embodiment, the high-speed GIO line HGIO has a data storage capacity greater than that of the GIO line GIO.

In an embodiment, the additional I/O unit 240 may include a SERDES circuit or a multiplexer.

In an embodiment, the I/O assembly 200b may include the I/O control unit 210 and the first and second sub I/O units 231 and 233.

The first sub I/O unit 231 receives the data group BKD including the remaining division data RBKD, and outputs the received data group BKD to an external part such as the controller 20 (see FIG. 1) through the pad PAD. The second sub I/O unit 233 receives the high-speed division data HBKD, and outputs the received high-speed division data HBKD to the external part through the pad PAD. In an embodiment, the first and second sub I/O units 231 and 233 serialize the remaining division data RBKD and the high-speed division data HBKD at a faster rate compared to when the I/O units 231 and 233 serialize other data groups BKDA, BKDB, and BKDD.

The first and second sub I/O units 231 and 233 may sequentially output data in response to the data strobe signal DQS. In an embodiment, the first and second sub I/O units 231 and 233 may have substantially the same configuration, so that the sub I/O units 231 and 233 may sequentially output data so as to output the data group BKDC of the data unit C 100c without collision. In this embodiment, the operation time points of the sub I/O units 231 and 233 can be controlled by the I/O control unit 210. Alternatively, the operation of the sub I/O units 231 and 233 can be controlled by adjusting a reception time of the data group BKD or HBKD by the first and second sub I/O units 231 and 233, respectively.

Figure 7:
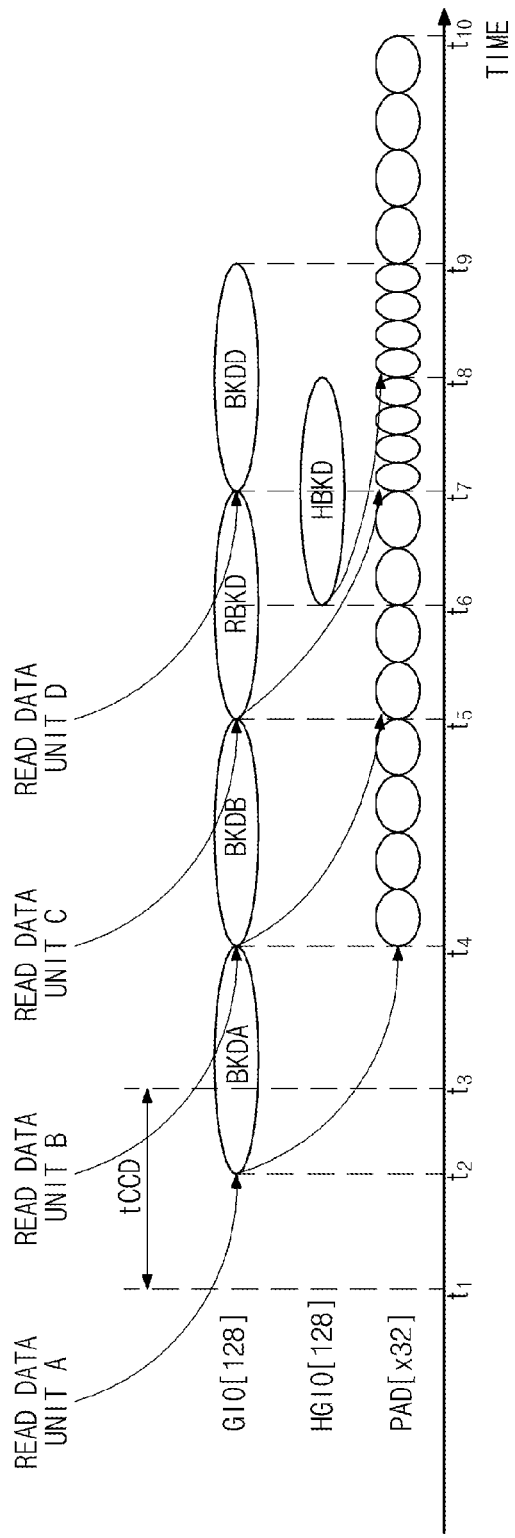
FIG. 7 is a timing diagram illustrating operations of the data I/O device shown in FIG. 6.

FIG. 7 is a timing diagram illustrating operations of the data I/O device 10b shown in FIG. 6.

Referring to FIG. 7, the data I/O device 10b receives the data-unit-A activation signal ACTB_A including the read command of the data unit A 100a at a first time t1. In response to the data-unit-A activation signal ACTB_A, the data group BKDA of the data unit A is loaded on the GIO line GIO at a second time t2, which is before the CAS-to-CAS Delay time $t_{CCD}$ elapses from the first time t1. Since each of the data groups BKDA, BKDB, and BKDD provided by the data unit A 100a, the data unit B 100b, and the data unit D 100d does not exceed available data latch capacity of the GIO line GIO or exceed load capacity of the first sub I/O unit 231, the data group BKDA, BKDB, and BKDD is not loaded on the high-speed GIO line HGIO.

The data group BKDA of the data unit A is output through the pad PAD of the first sub I/O unit 231 from a fourth time t4 to a fifth time t5.

At the fourth time t4, the data group BKDB of the data unit B is loaded on the GIO line in response to a read command of the data unit B 100b. The above data group BKDB is also output through the pad PAD from the fifth time t5 to a seventh time t7.

The remaining division data RBKD, which is a divided portion of the data group BKDC by the additional I/O unit 240, is loaded on the GIO line GIO from the time t5 to a sixth time t6 in response to the data-unit-C activation signal ACTB_C of the data unit C 100c having a different operation speed from the other data units A, B, and D. In addition, the high-speed division data HBKD divided by the additional I/O unit 240 is applied to the high-speed GIO line HGIO from the sixth time t6 to the seventh time t7.

The remaining division data RBKD received from the GIO line GIO is applied to the pad PAD through the first sub I/O unit 231 at the seventh time t7. The remaining division data RBKD is output through the pad PAD from the seventh time t7 to the eighth time t8. The high-speed division data HBKD received from the high-speed GIO line HGIO is applied to the pad PAD through the second sub I/O unit 233 at a time t8. The high-speed division data HBKD is output through the PAD from the eighth time t8 to a ninth time t9. In an embodiment, the speed of a data strobe signal DQS is increased to serialize and output the remaining division data RBKD and the high-speed division data HBKD at a faster rate than that associated with other data groups BKDA, BKDB, and BKDD.

The data group BKDD of the data unit D is loaded on the GIO line GIO at the seventh time t7, so that it is output through the pad PAD from the ninth time t9 to a tenth time t10.

Time intervals between the time at which each of the data groups BKDA, BKDB, BKDC, and BKDD is loaded on the GIO line or the HGIO line and the time at which each of the above data groups BKDA, BKDB, BKDC and BKDD is output through the pad PAD are substantially identical to one another.

However, the data I/O device according to this embodiment includes a high-speed global I/O line HGIO so as to provide double amount of data, and the I/O assembly 200b includes the second sub I/O unit 233, such that high-speed division data HBKD received through the HGIO line can be serialized and then output through the pad PAD.

Figure 8:
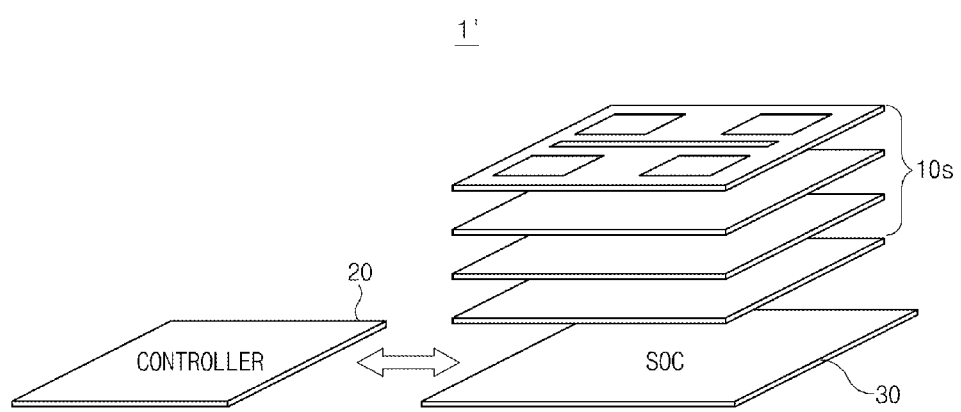
FIG. 8 is a diagram illustrating a data I/O system according to an embodiment.

FIG. 8 is a diagram illustrating a data I/O system 1' according to an embodiment.

Referring to FIG. 8, the data I/O system 1' may include a stacked data I/O device structure 10s including a plurality of data I/O devices (e.g., data I/O devices 10, 10a, and 10b shown in FIGS. 2, 4, and 6), a System on Chip (SoC) 30, and a controller 20.

The stacked data I/O device structure 10s is implemented by stacking a plurality of data I/O devices formed in a die, and a plurality of dies may be electrically coupled to each other through a through-silicon via (TSV).

The plurality of data I/O devices included in the stacked I/O device structure 10s may operate at different operation speeds, and may communicate with the controller 20 through the SoC 30.

The SoC 30 may include a plurality of constituent elements for controlling the stacked I/O device structure 10s. In an embodiment, a logic die may be disposed between the SoC 30 and the stacked I/O device structure 10s, such that the SoC 30 can cooperate with the stacked I/O device structure 10s through the logic die.

The data I/O system 1' according to an embodiment may perform data transmission/reception operations at different operation speeds, such that a data unit in the data I/O system 1' can be selected according to the type of a core in communication with the data unit. The data I/O system 1' may have operation flexibility, and thus may provide a data I/O device having design extensibility. For example, if a low power consumption is desired, the data I/O device and the data I/O system would select a data unit to communicate with a mobile core. If a high speed is desired, the data I/O device and the data I/O system would select another data unit to communicate with a graphic core. Therefore, by selecting elements (e.g., data unit) in the data I/O device or system according to a desired purpose (e.g., the low power consumption and high operation speed), the data I/O device or system can be driven in a desired direction.

The data I/O device and the system including the same according to an embodiment can selectively control the data I/O operation speed to process a plurality of data groups having different sizes of data, thereby resulting in an increase of a total operation speed to process the plurality of data groups.

As is apparent from the above description, the data I/O device and the data I/O system according to the embodiments include a plurality of data units configured to cooperate with a plurality of cores having various operation speeds, resulting in implementation of the operation design flexibility. Specifically, the data I/O device and the data I/O system can perform appropriate trade-off between power consumption and the operation speed.

Embodiments may be carried out in other ways than those set forth herein. Embodiments are to be construed as illustrative and not restrictive.

Variations and modifications are possible in the component parts and/or arrangements in the disclosure, the drawings and the accompanying claims. Alternative uses are also possible.

What is claimed is:

1. A data input/output (I/O) device comprising:
   a plurality of data units coupled to a global I/O (GIO) line through corresponding local I/O (LIO) lines and configured to receive and transmit a plurality of data groups through the corresponding LIO lines, at least one of the plurality of data units having a different operation speed; and
   an I/O assembly configured to perform serial/parallel conversion operations on the plurality of data groups including a high-speed data group and output results of the serial/parallel conversion operations, the high-speed data group output from the at least one of the plurality of data units having the different operation speed,
   wherein the I/O assembly includes:
      an I/O control unit configured to generate an additional I/O signal to control the serial/parallel conversion operations on the plurality of data groups based on a data-unit activation signal, the data-unit activation signal used to control the plurality of data units;
      an additional I/O unit configured to perform second serial/parallel conversion operations on at least some parts of the high-speed data group in response to the additional I/O signal, the additional I/O unit configured to output results of the second serial/parallel conversion operations; and
      an I/O unit configured to perform third serial/parallel conversion operations on a second plurality of data groups and to output results of the third serial/parallel conversion operations, the second plurality of data groups including other data groups than the high-speed data group and other parts of the high-speed data group than the at least some parts of the high-speed data group.

2. The data I/O device according to claim 1, wherein the I/O assembly is configured to increase a data rate in response to the additional I/O signal.

3. The data I/O device according to claim 1, wherein the additional I/O unit includes a SERializer/DESerializer (SERDES) circuit.

4. The data I/O device according to claim 1, wherein the plurality of data units includes a high-speed data unit for inputting and outputting the high-speed data group and a constant-speed data unit, and
wherein the high-speed data unit and the constant-speed data unit are configured to cooperate with different cores through the I/O assembly.

5. The data I/O device according to claim 4, wherein the high-speed data unit cooperates with a graphic core, and the constant-speed data unit cooperates with a mobile core.

6. A data I/O device comprising:
a constant-speed data unit coupled to a global I/O (GIO) line through a first local I/O (LIO) line and configured to input and output a constant-speed data group through the first LIO line;
a high-speed data unit configured to transmit and receive a high-speed data group to and from an additional I/O unit through a second LIO line;
the additional I/O unit configured to divide the high-speed data group into high-speed division data and remaining division data, and to output the high-speed division data to a high-speed global I/O (HGIO) line and the remaining division data to the GIO line; and
an I/O assembly configured to perform serial/parallel conversion operations on the constant-speed data group, the remaining division data, and the high-speed division data and to output results of the serial/parallel conversion operations.

7. The data I/O device according to claim 6, wherein the additional I/O unit includes at least one of a SERDES circuit and a multiplexer.

8. The data I/O device according to claim 6, wherein the I/O assembly includes:
an I/O control unit configured to generate an additional I/O signal to control the serial/parallel conversion operations of the constant-speed and high-speed data groups based on a data-unit activation signal, the data-unit activation signal used for controlling the constant-speed data unit and the high-speed data unit;
a first sub I/O unit configured to perform serial/parallel conversion operations on the constant-speed data group and the remaining division data; and
a second sub I/O unit configured to perform serial/parallel conversion operations on the high-speed division data.

9. The data I/O device according to claim 6, wherein the high-speed data unit and the constant-speed data unit are configured to cooperate with different cores through the I/O assembly.

10. The data I/O device according to claim 9, wherein the high-speed data unit cooperates with a graphic core, and the constant-speed data unit cooperates with a mobile core.

11. A data I/O system comprising:
a controller including a plurality of cores having different operation speeds and configured to control a data I/O device structure; and
the data I/O device structure including a plurality of data I/O devices, each data I/O device communicating with a corresponding one of the cores and configured to selectively activate an additional I/O device to support a high-speed operation of the data I/O device,
wherein the data I/O device includes:
a plurality of data units coupled to a global I/O (GIO) line through corresponding local I/O (LIO) lines and configured to input and output a plurality of data groups through the corresponding LIO lines, at least one of the plurality of data units having a different operation speed than another of the plurality of data units; and
an I/O assembly configured to perform serial/parallel conversion operations on the plurality of data groups and output results of the serial/parallel conversion operations, the plurality of data groups including a high-speed data group output from the at least one of the plurality of data units having the different operation speed, and
wherein the I/O assembly includes:
an I/O control unit configured to generate an additional I/O signal to control the serial/parallel conversion operations on the plurality of data groups based on a data-unit activation signal, the data-unit activation signal used to control the plurality of data units;
an additional I/O unit configured to perform second serial/parallel conversion operations on at least some parts of the high-speed data group in response to the additional I/O signal and to output results of the second serial/parallel conversion operations; and
an I/O unit configured to perform third serial/parallel conversion operations on a second plurality of data groups and to output results of the third serial/parallel conversion operations, the second plurality of data groups including other data groups than the high-speed data group and other parts of the high-speed data group than the at least some parts of the high-speed data group.

12. The data I/O system according to claim 11, wherein the plurality of cores having different operation speeds include a mobile core and a graphic core.

13. The data I/O system according to claim 11, wherein the plurality of data I/O devices is vertically stacked.

14. The data I/O system according to claim 13, wherein the stacked data I/O devices are electrically coupled to each other through a through-silicon via (TSV).

* * * * *